(12) United States Patent  
Eom et al.

(10) Patent No.: US 11,682,643 B2  
(45) Date of Patent: Jun. 20, 2023

(54) SEMICONDUCTOR CHIP HAVING CHIP PADS OF DIFFERENT SURFACE AREAS, AND SEMICONDUCTOR PACKAGE INCLUDING THE SAME

(71) Applicant: SK hynix Inc., Icheon-si Gyeonggi-do (KR)

(72) Inventors: Ju Il Eom, Icheon-si Gyeonggi-do (KR); Woo Jin Lee, Icheon-si Gyeonggi-do (KR); Hyung Ho Cho, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 173 days.

(21) Appl. No.: 17/240,198

(22) Filed: Apr. 26, 2021

(65) Prior Publication Data  
US 2022/0173061 A1 Jun. 2, 2022

(30) Foreign Application Priority Data

Nov. 30, 2020 (KR) .................. 10-2020-0165149

(51) Int. Cl.

| | |
|---|---|
| H01L 23/48 | (2006.01) |
| H01L 23/52 | (2006.01) |
| H01L 29/40 | (2006.01) |
| H01L 23/00 | (2006.01) |
| H01L 23/498 | (2006.01) |

(52) U.S. Cl.  
CPC ........ *H01L 24/09* (2013.01); *H01L 23/49827* (2013.01); *H01L 24/08* (2013.01); *H01L 24/16* (2013.01); *H01L 2224/08054* (2013.01); *H01L 2224/08055* (2013.01); *H01L 2224/0903* (2013.01); *H01L 2224/0913* (2013.01); *H01L 2224/09151* (2013.01); *H01L 2224/09515* (2013.01); *H01L 2224/16235* (2013.01); *H01L 2924/30105* (2013.01)

(58) Field of Classification Search  
CPC combination set(s) only.  
See application file for complete search history.

(56) References Cited

U.S. PATENT DOCUMENTS

| | | | |
|---|---|---|---|
| 7,400,134 B2 * | 7/2008 | Morishita | ........ G01R 31/31723 257/777 |
| 7,518,242 B2 | 4/2009 | Hirai | |
| 2005/0042838 A1 * | 2/2005 | Garyainov | .............. H01L 24/10 438/455 |

FOREIGN PATENT DOCUMENTS

KR   1020080068346 A   7/2008

\* cited by examiner

*Primary Examiner* — Niki H Nguyen  
(74) *Attorney, Agent, or Firm* — William Park & Associates Ltd.

(57) ABSTRACT

A semiconductor chip includes a chip body including a signal input/output circuit unit, a chip pad unit disposed on one surface of the chip body and including first and second chip pads having different surface areas from each other, and a chip pad selection circuit unit disposed in the chip body and electrically connected to the signal input/output circuit unit and the chip pad unit. The chip pad selection circuit unit is configured to select one chip pad of the first and second chip pads and electrically connect the selected one chip pad to the signal input/output circuit unit.

10 Claims, 6 Drawing Sheets

SEMICONDUCTOR CHIP HAVING CHIP PADS OF DIFFERENT SURFACE AREAS, AND SEMICONDUCTOR PACKAGE INCLUDING THE SAME

CROSS-REFERENCE TO RELATED APPLICATIONS

The present application claims priority under 35 U.S.C. 119(a) to Korean Application No. 10-2020-0165149, filed on Nov. 30, 2020, which is incorporated herein by reference in its entirety.

BACKGROUND

1. Technical Field

The present disclosure generally relates to packaging technology and, more particularly, to a semiconductor chip having chip pads of different surface areas and a semiconductor package including the same.

2. Related Art

Today, the semiconductor industry is evolving in a direction of manufacturing lightweight, compact, high-speed, multi-functional, high-performance, and highly reliable semiconductor products at low cost, and semiconductor packaging technology is an important part in achieving this. Semiconductor packaging technology refers to a technology for mounting a semiconductor chip with a circuit part formed through wafer processes on a package substrate, securing an electrical connection between the semiconductor chip and an external electronic device through the package substrate, protecting the semiconductor chip from an external environment, and the like. The technology for mounting a semiconductor chip on a package substrate includes a method of wire bonding the semiconductor chip and the package substrate, a method of flip-chip bonding the semiconductor chip and the package substrate, and the like.

SUMMARY

A semiconductor chip according to an embodiment of the present disclosure may include a chip body having a signal input/output circuit unit, a chip pad unit disposed on one surface of the chip body and including first and second chip pads having different surface areas from each other, and a chip pad selection circuit unit disposed in the chip body and electrically connected to the signal input/output circuit unit and the chip pad unit. The chip pad selection circuit unit may be configured to select one chip pad of the first and second chip pads and electrically connect the selected one chip pad to the signal input/output circuit unit.

A semiconductor package according to another embodiment of the present disclosure may include a package substrate and a semiconductor chip disposed on the package substrate. The package substrate may include a substrate body and a plurality of chip connection pads disposed on a surface of the substrate body. The semiconductor chip may include a chip body and a plurality of chip pad units disposed on a surface of the chip body, the surface of the chip body facing the surface of the substrate body, and the plurality of chip pad units corresponding to the plurality of chip connection pads. Each of the plurality of chip pad units may include first and second chip pads disposed to be spaced apart from each other and having different surface areas from each other. One chip pad of the first and second chip pads may be electrically connected to a chip connection pad of a corresponding chip pad unit among the plurality of chip pad units.

A semiconductor package according to another embodiment of the present disclosure may include a package substrate including a substrate body having an upper surface and a lower surface, and a semiconductor chip mounted over the upper surface of the substrate body. The package substrate may include a plurality of chip connection pads disposed on the upper surface of the substrate body and arranged along direction. The semiconductor chip may include a chip body including a signal input/output circuit unit; a plurality of chip pad units disposed on a surface of the chip body, the surface of the chip body facing the upper surface of the substrate body, and the plurality of chip pad units corresponding to the plurality of chip connection pads; and a chip pad selection circuit unit connected to the signal input/output circuit unit and the plurality of chip pad units. Each of the plurality of chip pad units may include first and second chip pads disposed to be spaced apart from each other and having different surface areas from each other. One chip pad of the first and second chip pads may be electrically connected to a corresponding chip connection pad among the plurality of chip connection pads.

DETAILED DESCRIPTION

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise," "include," or "have" are intended to specify the presence of a feature, a number, a step, an operation, a component, an element, a part, or combinations thereof, but not used to preclude the presence or possibility of adding one or more other features, numbers, steps, operations, components, elements, parts, or combinations thereof.

In this specification, the phrase "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

In this specification, bonding between one element and another element may include indirect bonding through an intermediate material interposed between the one element and the other element, in addition to direct bonding of the one element to the other element. As an example, the bonding between a chip connection pad of a package substrate and a chip pad of a semiconductor chip may mean not only that the chip connection pad and the chip pad are directly bonded, but also that a bonding material such as a bump or a solder material is interposed between the chip connection pad and the chip pad so that the chip connection pad and the chip pad are bonded to each other.

Figure 1:
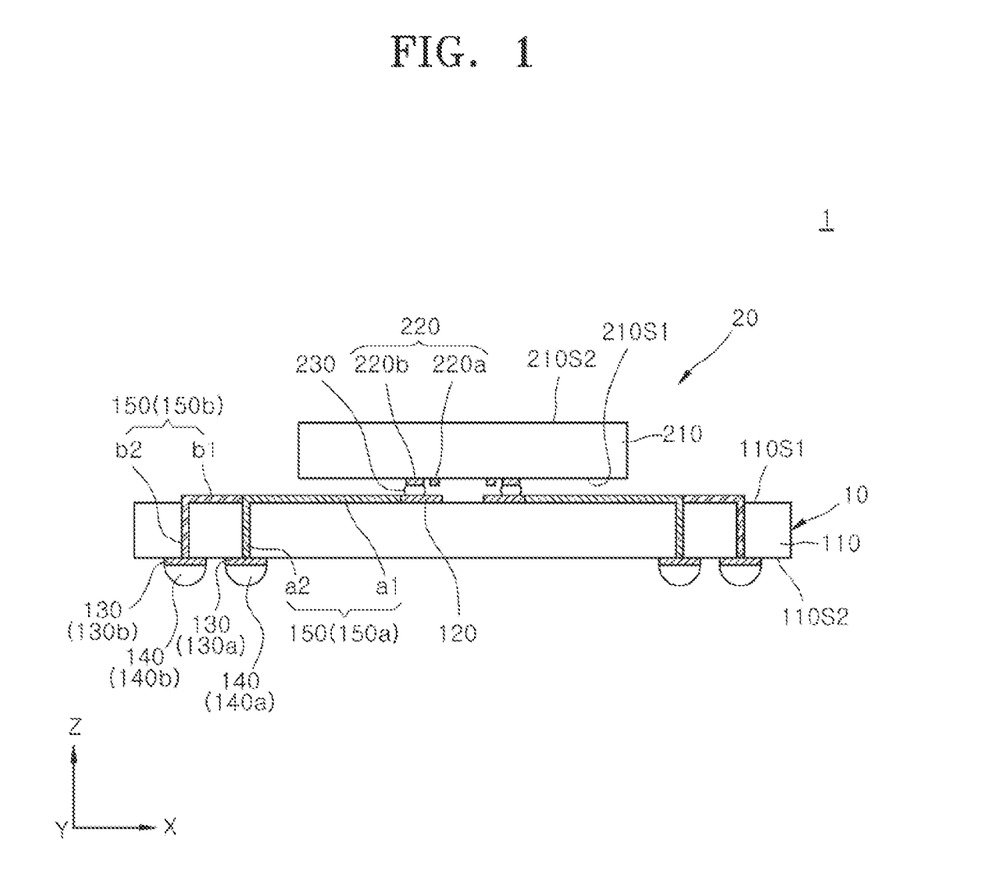
FIG. 1 is a cross-sectional view schematically illustrating a semiconductor package according to an embodiment of the present disclosure.

FIG. 1 is a cross-sectional view schematically illustrating a semiconductor package according to an embodiment of the present disclosure. Referring to FIG. 1, a semiconductor package 1 may include a package substrate 10 and a semiconductor chip 20 disposed on the package substrate 10. The package substrate 10 and the semiconductor chip 20 may be bonded to each other by conductive connectors 230. The conductive connectors 230 may include bumps, for example.

The package substrate 10 may include a substrate body 110 having an upper surface 110S1 and a lower surface 110S2. The package substrate 10 may include chip connection pads 120 disposed on the upper surface 110S1. The package substrate 10 may include a plurality of connection pads 130 disposed to be spaced apart from the chip connection pads 120. As an embodiment, the plurality of connection pads 130 may be disposed on the lower surface 110S2 of the substrate body 110. The package substrate 10 may include a plurality of connection structures 140 respectively disposed on the plurality of connection pads 130. The plurality of connection structures 140 may include, for example, bumps or solder balls. The plurality of connection structures 140 may be configured to be electrically connected to other semiconductor packages or other electronic systems, for example.

Although not illustrated in FIG. 1, in an embodiment, the chip connection pads 120 may be arranged on the upper surface 110S1 of the substrate body 110 along a direction (e.g., y-direction). The arrangement of the plurality of chip connection pads 120 will be described later with reference to FIG. 2. In addition, the connection pads 130 may be arranged on the lower surface 110S2 of the substrate body 110 along a direction (e.g., y-direction). The arrangement of the plurality of connection pads 130 will be described later with reference to FIG. 2. Hereinafter, for the convenience of description, when two different connection pads that are distinguished from each other are selected among the plurality of connection pads 130, the selected two connection pads are referred to as a first connection pad 130a and a second connection pad 130b, respectively. In this case, among the plurality of connection structures 140, the connection structure in contact with the first connection pad 130a may be referred to as a first connection structure 140a, and the connection structure in contact with the second connection pad 130b may be referred to as a second connection structure 140b.

Referring to FIG. 1, a plurality of wirings 150 may be disposed on/in the substrate body 110. First wirings 150a among the plurality of wirings 150 may electrically connect the first connection structures 140a to the corresponding chip connection pads 120. The second wirings 150b among the plurality of wirings 150 may electrically connect the second connection structures 140b to other chip connection pads 120 not illustrated in FIG. 1.

In an embodiment, the first wiring 150a and the second wiring 150b may have different lengths. Accordingly, when electrical signals are transmitted along the first and second wirings 150a and 150b, different parasitic capacitances may be generated in the first and second wirings 150a and 150b due to the difference in the lengths of the wirings. Referring to FIG. 1, the first and second wirings 150a and 150b may include first and second outer layer circuits a1 and b1, respectively, disposed on the upper surface 110S1 of the substrate body 110. Each of the first and second outer layer circuits a1 and b1 may have various shapes and lengths. As illustrated in FIG. 1, the first and second outer layer circuits a1 and b1 may have different path lengths. Accordingly, when electrical signals are transferred along the first and second outer layer circuits a1 and b1, different parasitic capacitances may be generated along the first and second outer layer circuits a1 and b1, respectively, based on the different lengths. In addition, the first and second wirings 150a and 150b may include first and second vias a2 and b2 connecting the first and second outer layer circuits a1 and b1 to the first and second connection pads 130a and 130b, respectively. As shown in FIG. 1, first and second vias a2 and b2 may have the same path lengths.

In some embodiments not illustrated in FIG. 1, a configuration of the plurality of wirings 150 may be variously modified. As an example, each of the plurality of wirings 150 may further include at least one inner layer circuit inside the substrate body 110. The at least one inner layer circuit may be electrically connected to the outer layer circuits and the connection pads through at least one via. In this case, according to the sum of the lengths of the outer layer circuit and the inner layer circuit, the magnitude of the parasitic capacitance generated in each of the plurality of wirings 150 may vary.

Referring to FIG. 1, the semiconductor chip 20 may include a chip body 210 having a first surface 210S1 and a second surface 210S2, and chip pad units 220 disposed on the first surface 210S1. The chip body 210 may include an internal integrated circuit. In an embodiment, the internal integrated circuit may be disposed in an inner region of the chip body 210 adjacent to the first surface 210S1. Although not illustrate in FIG. 1, the chip body 210 may include a signal input/output circuit unit electrically connected to the internal integrated circuit. The internal integrated circuit may process electrical signals by various methods. The electrical signals processed in the internal integrated circuit may be transferred to the signal input/output circuit and may reach the chip pad units 220 on the first surface 210S1. In addition, the electrical signals inputted through the chip pad units 220 from the package substrate 10 may pass through the signal input/output circuit unit and be transferred to the internal integrated circuit in the chip body 210. Electrical signal transmission between the signal input/output circuit unit and the chip pad units 220 will be described later with reference to FIG. 5.

The chip pad units 220 on the first surface 210S1 may be disposed to correspond to the chip connection pads 120 on the upper surface 110S1 of substrate body 110. Each of the chip pad units 220 may include first and second chip pads 220a and 220b disposed to be spaced apart from each other on the first surface 210S1. The first and second chip pads 220a and 220b may have different surface areas from each other on the first surface 210S1. One chip pad of the first and second chip pads 220a and 220b may be bonded to the corresponding chip connection pad 120 through the conductive connectors 230. A method of determining the one chip pad of the first and second chip pads 220a and 220b to be bonded to the chip connection pad 120 will be described later with reference to FIG. 6.

The one chip pad to be bonded to the chip connection pad 120 may function as a bonding pad. The signal input/output circuit unit may be electrically connected to the chip connection pad 120 of the package substrate 10 through the bonding pad. Referring to FIG. 1, the second chip pad 220b may function as the bonding pad. The other chip pad not to be bonded to the chip connection pad 120 between the first and second chip pads 220a and 220b may function as a test pad for testing the internal integrated circuit of the semiconductor chip 20. The test pad may be used as a connection pad for connecting an electrical test apparatus to the internal integrated circuit of the semiconductor chip 20. In an embodiment, the electrical test using the test pad may be performed before the semiconductor chip 20 is mounted on the package substrate 10.

Although not illustrated in FIG. 1, a chip pad selection circuit unit may be disposed in the chip body 210. The chip pad selection circuit unit is electrically connected to the first and second chip pads 220a and 220b and the signal input/output circuit unit, respectively. The chip pad selection circuit unit may be configured to select one of the bonding pad and the test pad (that is, one of the first and second chip pads 220a and 220b) and electrically connect the selected pad to the signal input/output circuit unit. A detailed configuration of the chip pad selection circuit unit will be described later with reference to FIG. 5.

Although not illustrated in FIG. 1, the chip pad units 220 may be arranged on the first surface 210S1 of the chip body 210 along one direction (e.g., y-direction). Each of the first and second chip pads 220a and 220b may be disposed along the one direction. The arrangement of the plurality of chip pad units 220 will be described later with reference to FIG. 3.

Figure 2:
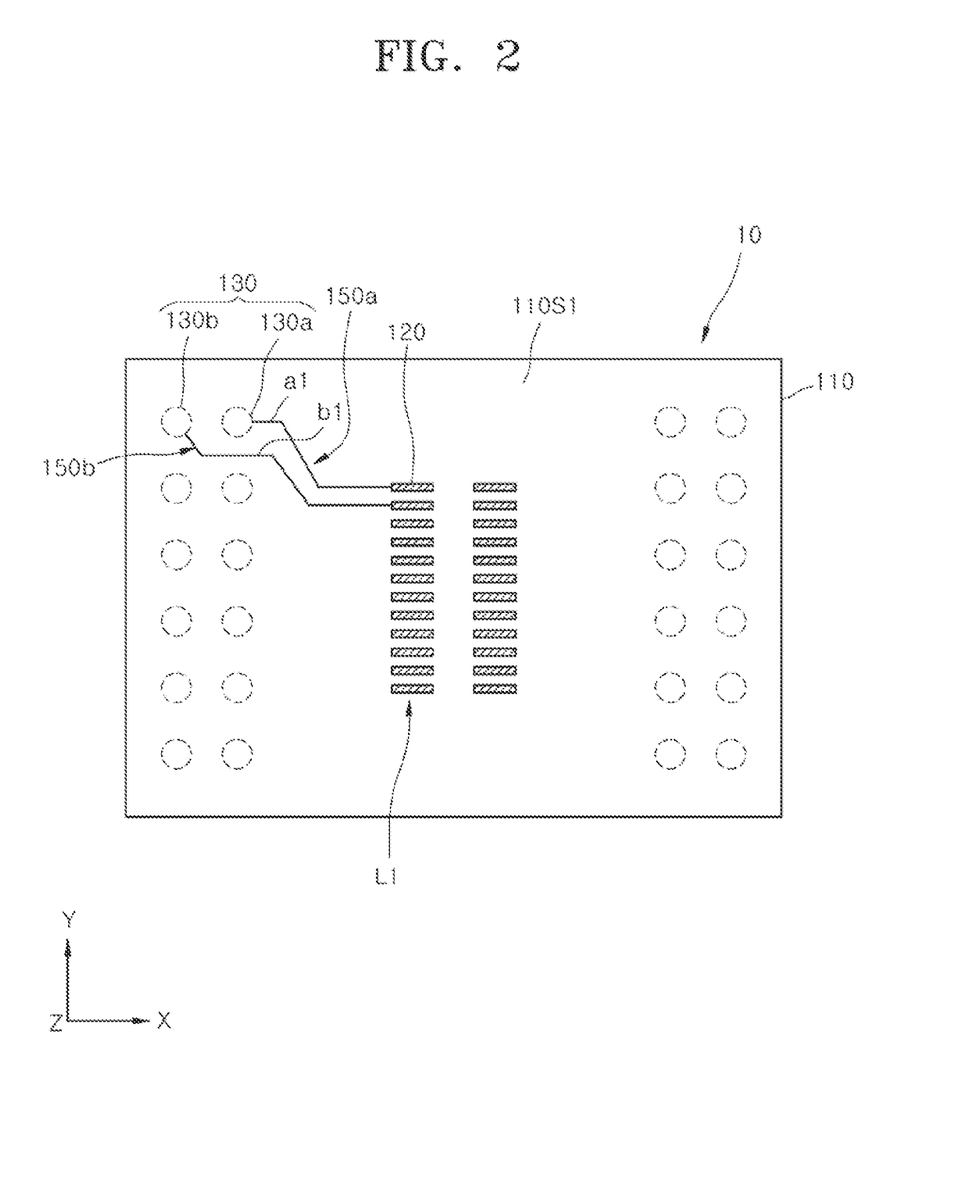
FIG. 2 is a plan view schematically illustrating a package substrate according to an embodiment of the present disclosure.

FIG. 2 is a plan view schematically illustrating a package substrate according to an embodiment of the present disclosure. FIG. 2 may be a plan view of the package substrate 10 of the semiconductor package 1 illustrated in FIG. 1.

Referring to FIG. 2, the plurality of chip connection pads 120 may be disposed on the upper surface 110S1 of the substrate body 110 along a first direction (e.g., y-direction). In an embodiment, the plurality of chip connection pads 120 may be disposed to form columns L1 along the first direction. A plurality of connection pads 130 may be disposed on a lower surface 110S2 of the substrate body 110. Although not illustrated in FIG. 2, connection structures (140 in FIG. 1) may be respectively disposed on the corresponding connection pads 130. As an example, as illustrated in FIG. 1, first connection structures 140a may be disposed on first connection pads 130a, and second connection structures 140b may be disposed on second connection pads 130b.

Referring to FIGS. 1 and 2 together, in an embodiment, each of the first connection structures 140a on the first connection pads 130a may be electrically connected to the corresponding chip connection pad among the plurality of chip connection pads 120 through the first wiring 150a. Each of the second connection structures 140b on the second connection pad 130b may be electrically connected to the corresponding chip connection pad among the plurality of chip connection pads 120 through the second wiring 150b. The first and second wirings 150a and 150b may have the corresponding first and second outer layer circuits a1 and b1. As illustrated in FIGS. 1 and 2, the first and second outer layer circuits a1 and b1 may have different path lengths. In an embodiment, each of the first connection pads 130a and each of the second connection pads 130b may be disposed adjacent to each other. Accordingly, each of the first connection structures 140a and each of the second connection structures 140b may be disposed adjacent to each other. However, is the present teachings are not necessarily limited thereto, and the arrangement configuration of the first and second connection pads 130a and 130b may be determined by a design configuration of the package substrate 10. The design configuration may include various arrangement configurations for, for example, the connection pads 130, the connection structures 140, and the wirings 150 according to the function and use of the semiconductor package 1. Although not shown in FIG. 2, all of the connection pads 130 may be connected to the corresponding chip connection pads 120 by outer layer circuits on the upper surface 110S1 in the same manner.

Referring to FIGS. 1 and 2 together, the plurality of wirings 150 may be disposed to connect each of the plurality of connection structures 140 to the corresponding chip connection pads 120. In FIG. 2, for the convenience of description, as examples of the plurality of wirings 150, the first wiring 150a and the second wiring 150b are illustrated. The first wiring 150a may have a first outer layer circuit a1 on the upper surface 110S1, and the second wiring 150b may a second outer layer circuit b1 on the upper surface 110S1. In an embodiment, a length of each of the plurality of wirings 150 may be different. As the length of the wiring 150 is shorter, the parasitic capacitance of the semiconductor package 1 generated by the wirings 150 on the substrate body 110 may decrease.

In an embodiment, a length of the first outer layer circuit a1 may be shorter than a length of the second wiring 150b. As shown in FIG. 1 when the first and second vias a2 and b2 have the same path lengths, a length of the first wiring 150a having the first outer layer circuit a1 may be shorter than a length of the second wiring 150b having the second outer layer circuit b1. In this case, the parasitic capacitance generated by the first wiring 150a may be smaller than the parasitic capacitance generated by the second wiring 150b. Hereinafter, the parasitic capacitance generated by the wirings described above is referred to as "package parasitic capacitance."

In an embodiment of the present disclosure, a configuration is provided to compensate for a difference in the package parasitic capacitance due to the difference in lengths of the plurality of wirings 150. The difference in the package parasitic capacitance may be generated for the plurality of wirings 150 connected to the plurality of chip connection pads 120. As described below with reference with FIG. 3, each of the chip connection pads 120 respectively connected to the first wiring 150a and the second wiring 150b are connected to one of the first and second chip pads 220a and 220b having different surface areas with each other, to compensate for the difference in the package parasitic capacitance described above.

Figure 3:
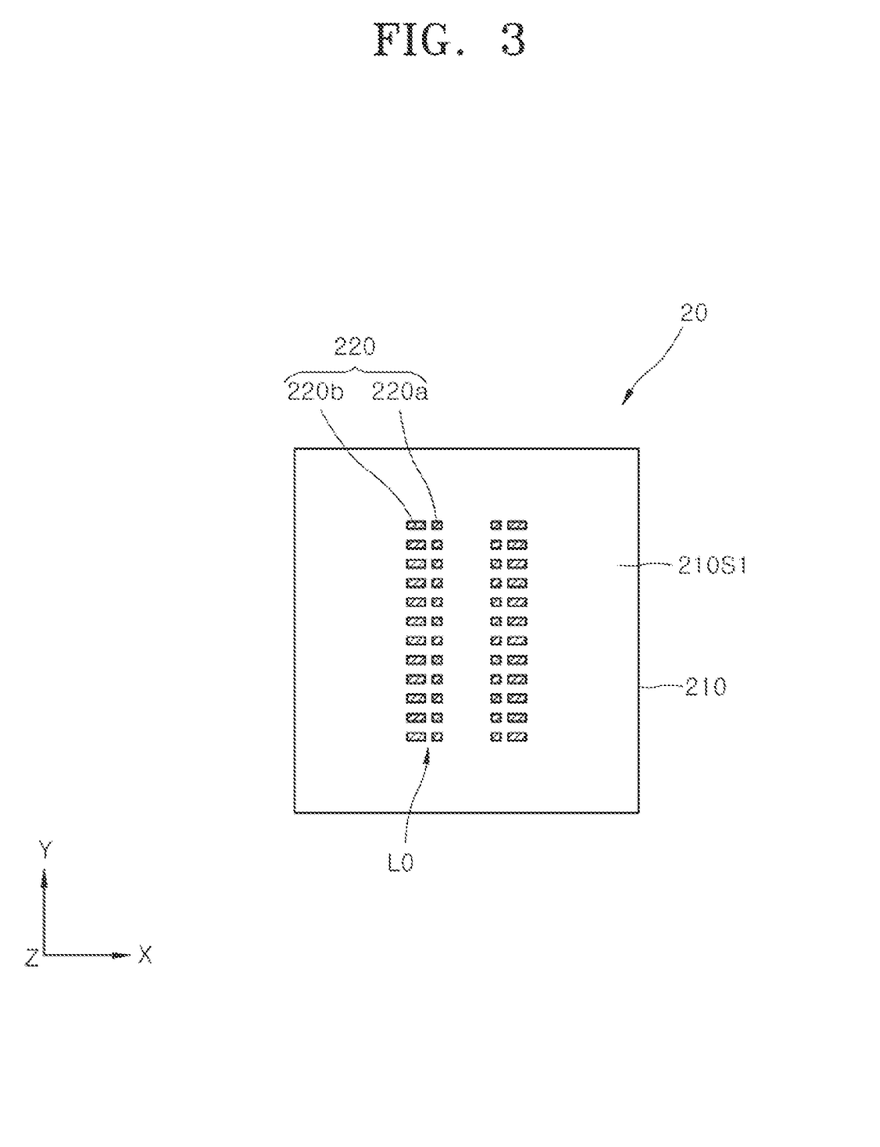
FIG. 3 is a plan view schematically illustrating a semiconductor chip according to an embodiment of the present disclosure.

FIG. 3 is a plan view schematically illustrating a semiconductor chip according to an embodiment of the present disclosure. FIG. 3 may be a plan view of the semiconductor chip 20 of the semiconductor package 1 illustrated in FIG. 1.

Referring to FIG. 3, a plurality of chip pad units 220 may be disposed on the first surface 210S1 of a chip body 210. The plurality of chip pad units 220 may be disposed in the first direction (e.g., y-direction). As an embodiment, the plurality of chip pad units 220 may be disposed to form columns L0 along the first direction.

Each of the plurality of chip pad units 220 may be disposed spaced apart from each other and include first and second chip pads 220a and 220b having different surface areas from each other. In an embodiment, and as illustrated in FIG. 3, the first chip pad 220a may have a smaller surface area than the second chip pad 220b.

Referring to FIG. 3, the plurality of first chip pads 220a may be disposed to form columns along the first direction. The plurality of second chip pads 220b may be disposed to be spaced apart from the plurality of first chip pads 220a and to form columns along the first direction.

Figure 4:
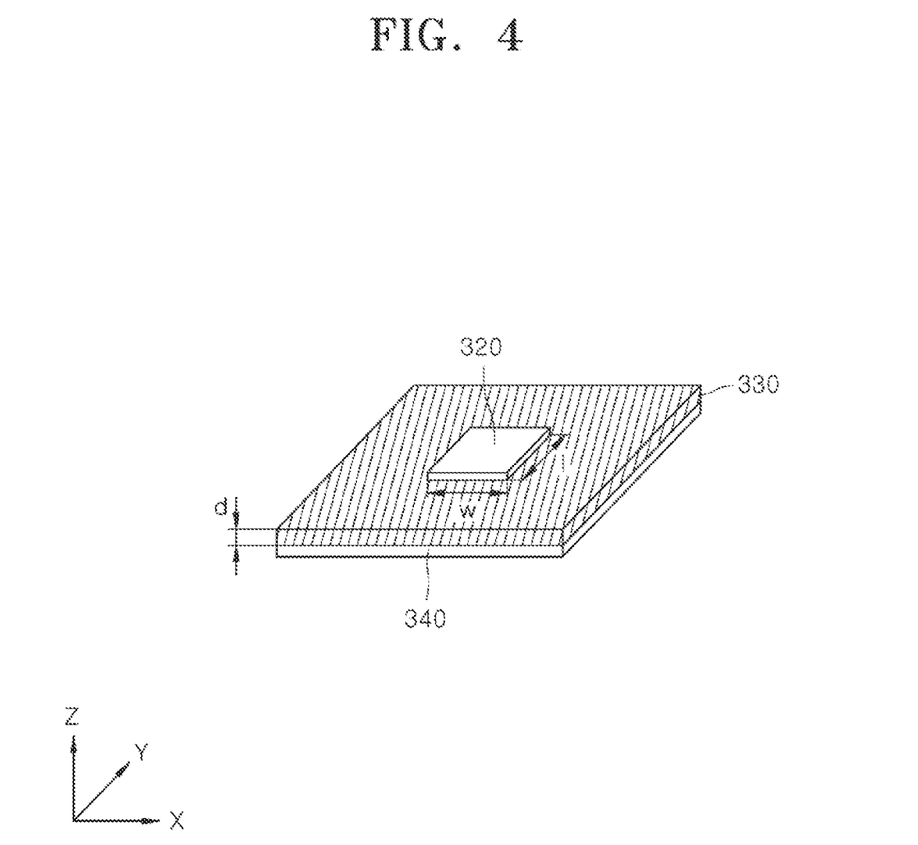
FIG. 4 is a view schematically illustrating a parasitic capacitance generated by a chip pad of a semiconductor chip according to an embodiment of the present disclosure.

FIG. 4 is a view schematically illustrating a parasitic capacitance generated by a chip pad of a semiconductor chip according to an embodiment of the present disclosure. FIG. 4 schematically illustrates a chip pad 320, an inner circuit layer 340, and an interlayer dielectric layer 330 disposed on one surface of a semiconductor chip.

The chip pad 320 and the inner circuit layer 340 are conductive layers and the interlayer dielectric layer 330 may be interposed between the chip pad 320 and the inner circuit layer 340. The parasitic capacitance generated between the chip pad 320 and the inner circuit layer 340 may be proportional to a dielectric constant of the interlayer dielectric layer 330 and a product W*l representing the area of the chip pad 320, and may be inversely proportional to a thickness d of the interlayer dielectric layer 330. Accordingly, as the surface area of the chip pad 320 decreases, the parasitic capacitance generated between the chip pad 320 and the inner circuit layer 340 may decrease. Hereinafter, the parasitic capacitance generated between the chip pad on the semiconductor chip and the inner circuit layer in the semiconductor chip is referred to as "pad parasitic capacitance."

Referring to FIGS. 3 and 4 together, when a chip pad having a small surface area between the first and second chip pads 220a and 220b is electrically connected to a corresponding chip connection pad 120, the pad parasitic capacitance in the semiconductor package 1 may be relatively small. On the other hand, when a chip pad having a large surface area between the first and second chip pads 220a and 220b is connected to a corresponding chip connection pad 120, the pad parasitic capacitance in the semiconductor package 1 may be relatively large. That is, each of the first and second chip pads 220a and 220b may exhibit or have a pad parasitic capacitance proportional to the surface area of the first and second chip pads 220a and 220b.

Figure 5:
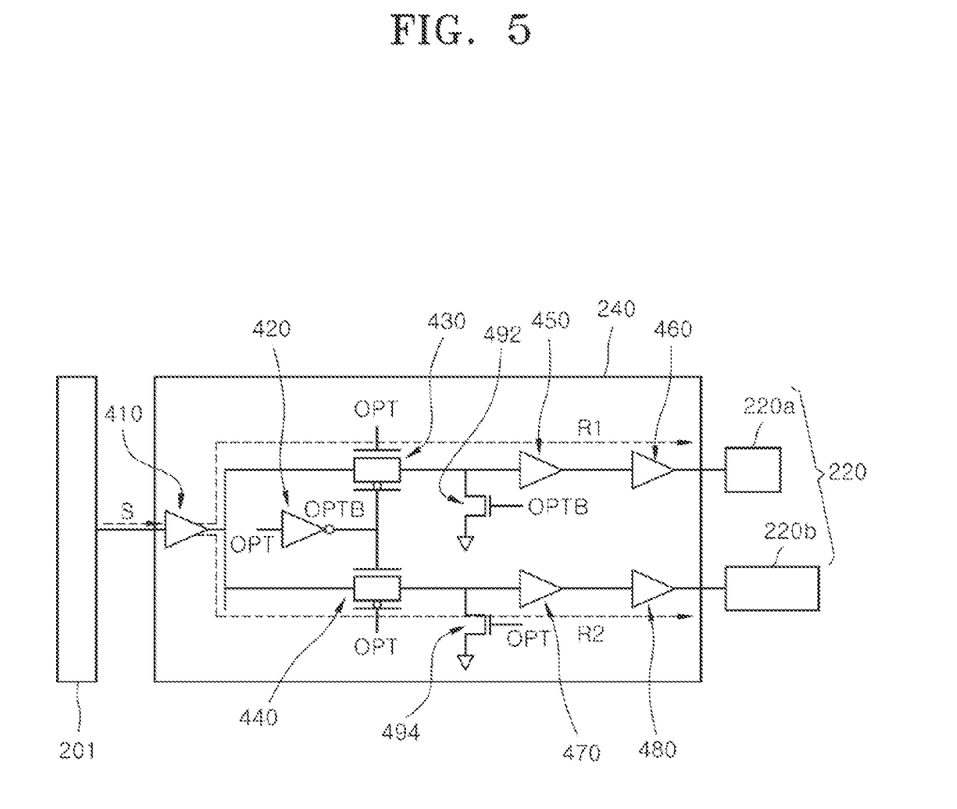
FIG. 5 is a circuit diagram of a chip pad selection circuit unit of a semiconductor chip according to an embodiment of the present disclosure.

FIG. 5 is a circuit diagram of a chip pad selection circuit unit of a semiconductor chip according to an embodiment of the present disclosure. Referring to FIG. 5, a chip pad selection circuit unit 240 may be disposed in the semiconductor chip 20 of the semiconductor package 1 of FIGS. 1 and 3.

Referring to FIG. 5, the chip pad selection circuit unit 240 may be connected to the signal input/output circuit unit 201 and the chip pad unit 220 in the chip body 210 in FIG. 3. The signal input/output circuit unit 201 may be connected to an internal integrated circuit of the semiconductor chip 20. In an embodiment, the chip pad selection circuit unit 240 may be disposed between the signal input/output circuit unit 201 and the chip pad unit 220 of the chip body 210. The chip pad selection circuit unit 240 may be disposed inside the chip body 210. The chip pad selection circuit unit 240 may selected one of two chip pads 220a and 220b and connect the selected chip pad to the signal input/output circuit unit 201. A chip pad selection circuit unit 240 may function for each of the plurality of chip pad units 220 in FIG. 3.

The chip pad selection circuit unit 240 may be configured to select one chip pad between the first and second chip pads 220a and 220b and electrically connect the selected chip pad to the signal input/output selection circuit 201. As an example, the chip pad selection circuit unit 240 may be configured to electrically connect the selected chip pad to the signal input/output selection circuit unit 201 and to electrically open the other chip pad that is not selected between the first and second chip pads 220a and 220b from the signal input/output selection circuit unit 201. In an embodiment, when performing electrical test for an internal integrated circuit, the chip pad selection circuit unit 240 may provide one pad of the first and second chip pads 220a and 220b as a test pad through the electrical connection. When electrically connecting the internal integrated circuit to the package substrate, the chip pad selection circuit unit 240 may provide the other pad of the first and second chip pads 220a and 220b as a bonding pad through the electrical connection.

Hereinafter, a method of operating the chip pad selection circuit unit 240 will be schematically described with reference to FIG. 5. First, signal information S is transferred from the signal input/output circuit unit 201 into an input buffer 410 of the chip pad selection circuit unit 240. The input buffer 410 transfers the signal information S to first and second transfer transistors 430 and 440. In this case, a separate control signal OPT may be inputted to an input terminal of an inverter 420 connected to each of the first and second transfer transistors 430 and 440. The control signal OPT is any one of a signal of 'high' and a signal of 'low'. The signal of 'high' is distinguishable from the signal of 'low.' For example, the signal of 'high' has a higher voltage than the signal of 'low.' The signal of 'high' may turn on an NMOS transistor in the chip pad selection circuit unit 240, and the signal of 'low' may turn on a PMOS transistor in the chip pad selection circuit unit 240.

When the control signal OPT is a signal of 'high', an inverted control signal OPTB outputted from the inverter 420 may turn on the first transfer transistor 430, and the signal information S may be outputted to the first chip pad 220a through first and second buffers 450 and 460. The transfer of the signal information S is illustrated as a first signal path R1. In this case, a first transistor 492 for preventing malfunction of signal transfer may be disposed on the first signal path R1. The first transistor 492 may be controlled by the inverted control signal OPTB.

Meanwhile, when the control signal OPT is a signal of 'low', the inverted control signal OPTB outputted from the inverter 420 may turn on the second transfer transistor 440, and the signal information S may be outputted to the second chip pad 220b through third and fourth buffers 470 and 480. The transfer of the signal information S is illustrated as a second signal path R2. In this case, a second transistor 494 for preventing malfunction of signal transfer may be disposed on the second signal path R2. The second transistor 494 may be controlled by the control signal OPT.

Referring to FIG. 5 again, one of the first and second chip pads 220a and 220b may function as a bonding pad. That is, one of the first and second chip pads 220a and 220b may be bonded to a corresponding chip connection pad 120 of the substrate body 110 of FIGS. 1 and 2. The other of the first and second chip pads 220a and 220b may function as a test pad. The test pad may function as a pad through which a test device for testing the semiconductor chip 20 is electrically connected to the internal integrated circuit of the semiconductor chip 20.

In an embodiment, the chip pad selection circuit unit 240 may electrically connect the signal input/output circuit unit 201 to the test pad during testing the semiconductor chip 20 using the test device. In this case, the signal input/output circuit unit 201 and the bonding pad may maintain an electrically open state. After testing the semiconductor chip 20 using the test pad, the semiconductor chip 20 may be bonded to the package substrate (10 of FIG. 1). After bonding the semiconductor chip 20 to the package substrate 10, the chip pad selection circuit unit 240 may electrically connect the signal input/output circuit unit 201 to the bonding pad and electrically open the signal input/output circuit unit 201 from the test pad. Accordingly, after the testing for the semiconductor package 1 is completed, the internal integrated circuit may maintain an electrically connected state to the bonding pad and may maintain an electrically open state from the test pad.

In an embodiment of the present disclosure, the reference for selecting the bonding pad and the test pad from the first and second chip pads 220a and 220b may be a length of wiring that reaches a corresponding connection structure 140 (or the connection pad 130) from the chip connection pad 120 of the package substrate 10 overlapping the first and second chip pads 220a and 220b, as described below in connection with FIG. 6.

Figure 6:
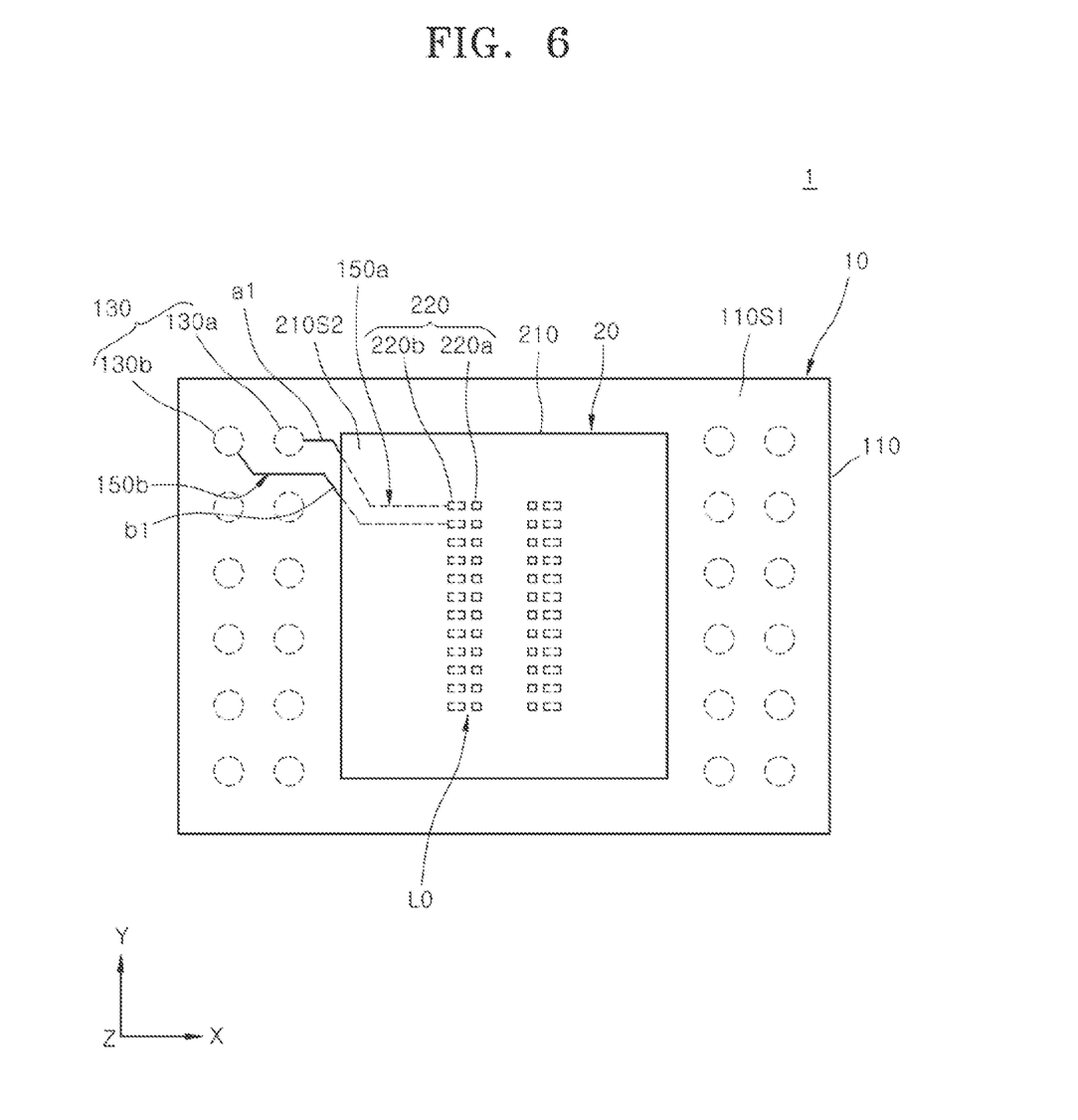
FIG. 6 is a plan view schematically illustrating a semiconductor package according to an embodiment of the present disclosure.

FIG. 6 is a plan view schematically illustrating a semiconductor package according to an embodiment of the present disclosure. FIG. 6 may be a view in which the semiconductor chip 20 of FIG. 3 is mounted on the upper surface 110S1 of the package substrate 10 of FIG. 2. In addition, FIG. 6 may be a plan view of the semiconductor package 1 illustrated in FIG. 1.

Referring to FIGS. 1, 2, and 6, the plurality of chip pad units 220 on first surface 210S1 of the semiconductor chip 20 may be disposed to face and overlap with the plurality of chip connection pads 120 on the upper surface 110S1 of the semiconductor substrate 10. Each of the plurality of chip pad units 220 may include first chip pad 220a and second chip pad 220b that are disposed to be spaced apart from each other and have different surface areas with respect to each other. Referring to FIG. 6, in an embodiment, the first chip pad 220a may have a smaller surface area than the second chip pad 220b. Referring to FIGS. 1, 2, and 6, in each of the plurality of chip pad units 220, the first and second chip pads 220a and 220b may be disposed to overlap with the corresponding chip connection pad 120 together.

In an embodiment, with respect to each of the plurality chip pad units 220, the chip connection pad 120 overlapping with one chip pad unit 220 may be electrically connected to the connection structure 140 using the wiring 150. In this case, depending on a length of the wiring 150 connecting the connection structure 140 and the chip connection pad 120, the bonding pad to be bonded to the chip connection pad 120 may be determined between the first and second chip pads 220a and 220b of the chip pad unit 220.

In an embodiment, referring to FIGS. 1, 2 and 6 together, two connection structures 140a and 140b may be selected from the plurality of connection structures 140. In an embodiment, the two connection structures 140a and 140b may be determined by the design configuration of the package substrate 10. The design configuration may include various arrangement configurations for the connection pad 130, the connection structure 140, and the wiring 150 according to the function and use of the semiconductor package, for example. The first connection structure 140a between the two connection structures 140a and 140b may be connected to the corresponding chip connection pad 120 by the first wiring 150a through the first connection pad 130a. The second connection structure 140b between the two connection structures 140a and 140b may be connected to the corresponding chip connection pad 120 by the second wiring 150b through the second connection pad 130b. As illustrated in FIGS. 1, 2, and 6, the length of the first wiring 150a including the first outer layer circuit a1 may be shorter than the length 150b of the second wiring including the second outer layer circuit b1. In this case, the chip connection pad 120 connected to the first wiring 150a may be bonded to the second chip pad 220b having a large surface area between the first and second chip pads 220a and 220b. The chip connection pad 120 connected to the second wiring 150b may be bonded to the first chip pad 220a having a small surface area between the first and second chip pads 220a and 220b.

Between the first and second wirings 150a and 150b connected to the first and second connection structures 140a and 140b, respectively, the first wiring 150a having a short length may exhibit or have a relatively small package parasitic capacitance on the signal path compared to the second wiring 150b. In this case, the chip connection pad 120 connected to the first wiring 150a may be bonded to the second chip pad 220b having a relatively large surface area. Accordingly, the signal path from the chip connection pad 120 to the internal integrated circuit through the second chip pad 220b may have a relatively large pad parasitic capacitance. As a result, the signal path from the first connection structure 140a to the internal integrated circuit through the first connection pad 130a, the first wiring 150a, the chip connection pad 120, and the second chip pad 220b may have a relatively small package parasitic capacitance and a relatively large pad parasitic capacitance.

Meanwhile, between the first and second wirings 150a and 150b, the second wiring 150b having a longer length may exhibit or have a relatively large package parasitic capacitance on the signal path compared to the first wiring 150a. In this case, the chip connection pad 120 connected to the second wiring 150b may be bonded to the first chip pad 220a having a relatively small surface area. Accordingly, the signal path from the chip connection pad 120 to the internal integrated circuit through the first chip pad 220a may have a relatively small pad parasitic capacitance. As a result, the signal path from the second connection structure 140b to the internal integrated circuit through the second connection pad 130b, the second wiring 150b, the chip connection pad 120, and the first chip pad 220a may have a relatively large package parasitic capacitance and a relatively small pad parasitic capacitance.

Through the above-described method, the chip pads to which the chip connection pads respectively connected to the plurality of connection structures 140 are bonded may be determined. In an embodiment of the present disclosure, the difference in package parasitic capacitance generated in the package substrate 10 due to the difference in lengths of the plurality of wirings 150 between each of the plurality of connection structures 140 and each of the corresponding plurality of chip connection pads 120 may be offset by using the different pad parasitic capacitances. In other words, a deviation of the sum of the package parasitic capacitance and the pad parasitic capacitance generated in each of the plurality of signal paths passing through the plurality of chip connection pads 120 of the semiconductor package may be reduced.

As a result, in the signal transfer path from each of the plurality of connection structures of the package substrate to the internal integrated circuit of the semiconductor chip through the corresponding chip connection pad and the chip pad, a deviation of the sum of parasitic capacitances generated in the signal transfer path may be reduced. As a result, the electrical reliability of a semiconductor package may be improved by reducing a variation in transfer characteristics of an electrical signal generated for each of the plurality of connection structures.

The present teachings have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather an illustrative standpoint. The scope of the present teachings is not limited to the above descriptions but defined by the accompanying claims, and all of distinctive features in the equivalent scope should be construed as being included in the inventive concept.

What is claimed is:

1. A semiconductor package comprising:
   a package substrate; and
   a semiconductor chip disposed on the package substrate,
   wherein the package substrate comprises:
   a substrate body; and
   a plurality of chip connection pads disposed on a surface of the substrate body,
   wherein the semiconductor chip comprises:
   a chip body; and
   a plurality of chip pad units disposed on a surface of the chip body, the surface of the chip body facing the surface of the substrate body, and the plurality of chip pad units corresponding to the plurality of chip connection pads,
   wherein each of the plurality of chip pad units comprises first and second chip pads disposed to be spaced apart from each other and having different surface areas from each other, and
   wherein one chip pad of the first and second chip pads is electrically connected to a corresponding chip connection pad among the plurality of chip connection pads
   wherein the semiconductor package further comprises:
   a plurality of connection pads disposed on the substrate body and spaced apart from the plurality of chip connection pads;
   a plurality of wirings configured to electrically connect the plurality of chip connection pads to the plurality of connection pads, respectively, on the substrate body; and
   first and second connection structures disposed on the plurality of the connection pads,
   wherein the first connection structure is electrically connected to a first chip connection pad among the plurality of chip connection pads through a first wiring,
   wherein the second connection structure is electrically connected to the second chip connection pad among the plurality of chip connection pads through a second wiring,
   wherein a length of the first wiring is shorter than a length of the second wiring,
   wherein the first chip connection pad is electrically connected to a chip pad having a larger surface area between the first and second chip pads of a corresponding chip pad unit among the plurality of chip pad units, and
   wherein the second chip connection pad is electrically connected to a chip pad having a smaller surface area between the first and second chip pads of a corresponding chip pad unit among the plurality of chip pad units.

2. The semiconductor package of claim 1,
   wherein the semiconductor chip further comprises:
   a signal input/output circuit unit disposed in the chip body; and
   a chip pad selection circuit unit electrically connected to the signal input/output circuit unit and the plurality of chip pad units, and
   wherein the chip pad selection circuit unit is configured to select the one chip pad of the first and second chip pads and electrically connect the selected one chip pad to the signal input/output circuit unit.

3. The semiconductor package of claim 2, wherein the chip pad selection circuit unit is further configured to electrically open the other chip pad not selected among the first and second chip pads from the signal input/output circuit unit.

4. The semiconductor package of claim 1,
   wherein a signal path from the first connection structure to an internal integrated circuit of the semiconductor chip through the first chip connection pad is configured to have a large pad parasitic capacitance compared to a signal path from the second connection structure to the internal integrated circuit of the semiconductor chip through the second chip connection pad.

5. A semiconductor package comprising:
   a package substrate including a substrate body having an upper surface and a lower surface; and
   a semiconductor chip mounted over the upper surface of the substrate body,
   wherein the package substrate comprises a plurality of chip connection pads disposed on the upper surface of the substrate body and arranged along a direction,
   wherein the semiconductor chip comprises:
   a chip body including a signal input/output circuit unit;
   a plurality of chip pad units disposed on a surface of the chip body, the surface of the chip body facing the upper surface of the substrate body, and the plurality of chip pad units corresponding to the plurality of chip connection pads, and
   a chip pad selection circuit unit connected to the signal input/output circuit unit and the plurality of chip pad units,
   wherein each of the plurality of chip pad units comprises first and second chip pads disposed to be spaced apart from each other and having different surface areas from each other, and
   wherein one chip pad of the first and second chip pads is electrically connected to a corresponding chip connection pad among the plurality of chip connection pads wherein the semiconductor package further comprises:

a plurality of connection pads disposed on the lower surface of the substrate body;

a plurality of wirings electrically connecting the plurality of chip connection pads to corresponding connection pads of the plurality of connection pads, respectively; and first and second connection structures disposed on the first and second connection pads, respectively, among the plurality of connection pads, wherein the first connection structure is electrically connected to a first chip connection pad among the plurality of chip connection pads through a first wiring, wherein the second connection structure is electrically connected to a second chip connection pad among the plurality of chip connection pads through a second wiring, wherein a length of the first wiring is shorter than a length of the second wiring, wherein the first chip connection pad is electrically connected to a chip pad having a larger surface area between the first and second chip pads of a corresponding chip pad unit among the plurality of chip pad units, and wherein the second chip connection pad is electrically connected to a chip pad having a smaller surface area between the first and second chip pads of a corresponding chip pad unit among the plurality of chip pad units.

6. The semiconductor package of claim 5, wherein the chip pad selection circuit unit is further configured to electrically open the other chip pad not selected among the first and second chip pads from the signal input/output circuit unit.

7. The semiconductor package of claim 5, wherein in each of the plurality of chip pad units:

one chip pad of the first and second chip pads is a bonding pad electrically connected to a corresponding chip connection pad among the plurality of chip connection pads, and the other chip pad of the first and second chip pads is a test pad provided to be connected to a test device.

8. The semiconductor package of claim 7, wherein the signal input/output circuit unit is electrically connected to the corresponding chip connection pad through the bonding pad.

9. The semiconductor package of claim 5, wherein in each of the plurality of chip pad units, the first and second chip pads are disposed to overlap with the corresponding chip connection pad.

10. The semiconductor package of claim 5, wherein a signal path from the first connection structure to the internal integrated circuit of the semiconductor chip through the first chip connection pad is configured to have a large pad parasitic capacitance compared to a signal path from the second connection structure to the internal integrated circuit of the semiconductor chip through the second chip connection pad.

* * * * *